United States Patent [19]
Flanigan

[11] Patent Number: 6,051,122
[45] Date of Patent: Apr. 18, 2000

[54] DEPOSITION SHIELD ASSEMBLY FOR A SEMICONDUCTOR WAFER PROCESSING SYSTEM

[75] Inventor: Allen Flanigan, San Jose, Calif.

[73] Assignee: Applied Materials, Inc., Santa Clara, Calif.

[21] Appl. No.: 08/917,673

[22] Filed: Aug. 21, 1997

[51] Int. Cl.[7] ............................ C23C 14/34; C23C 16/00; C23C 14/50

[52] U.S. Cl. ................................ 204/298.11; 204/298.15; 204/298.31; 118/720; 118/728; 156/345

[58] Field of Search ....................... 204/298.11, 298.15, 204/298.31; 118/500, 503, 504, 720, 728, 729, 725; 156/345

[56] References Cited

U.S. PATENT DOCUMENTS

| | | | |
|---|---|---|---|
| 5,262,029 | 11/1993 | Erksine et al. ................. | 204/298.15 |
| 5,280,156 | 1/1994 | Niori et al. ..................... | 118/725 |
| 5,447,570 | 9/1995 | Schmitz et al. ................ | 118/725 |
| 5,803,977 | 9/1998 | Tepman et al. ................ | 118/728 |

*Primary Examiner*—Rodney McDonald
*Attorney, Agent, or Firm*—Thomason, Moser and Patterson

[57] ABSTRACT

A readily removable deposition shield assembly for processing chambers such as chemical vapor deposition (CVD), ion implantation, or physical vapor deposition (PVD) or sputtering chambers, is disclosed. The shield assembly includes a shield member which is mounted to the chamber for easy removal, such as by screws, and defines a space along the periphery of the substrate support. A shadow ring is inserted into the peripheral space and is thus mounted in removable fashion and is automatically centered about the substrate by an alignment ring. The alignment ring removably rests upon a flange extending from the outer periphery of an electrostatic chuck. The shadow ring overlaps the cylindrical shield member, the alignment ring and the peripheral edge of a substrate retained by the chuck. Collectively, these components prevent deposition on the chamber and hardware outside the processing region.

20 Claims, 2 Drawing Sheets

DEPOSITION SHIELD ASSEMBLY FOR A SEMICONDUCTOR WAFER PROCESSING SYSTEM

BACKGROUND OF THE INVENTION

1. Field of the Invention

This invention relates generally to deposition shields for processing chambers, including for example physical vapor deposition or sputtering chambers, chemical vapor deposition chambers and ion implantation chambers. More specifically, the invention relates to a deposition shield assembly for protecting an electrostatic chuck from the deposition species during semiconductor wafer processing.

2. Description of the Background Art

In deposition processes, species from a source such as a target, a gas inlet manifold and the like may deposit on exposed internal chamber surfaces, including the chamber walls and hardware. Shields are available which are designed to intercept such species. However, the presently available shields have not been successful in completely blocking unwanted deposition on these surfaces. Also, such shields may be difficult and/or time-consuming to replace, and require relatively frequent replacement. The use of automatic substrate exchange systems, with their attendant in-chamber movable components, increases the difficulty of attaining adequate shielding and easy replacement of these shields.

Furthermore, recent developments in high temperature semiconductor processing, such as high temperature physical vapor deposition (PVD), have begun using substrate support and retention pedestals that contain electrostatic chucks. The performance of such chucks is substantially reduced if the chuck is exposed to the deposition species. The interference with chuck performance is especially pronounced when the deposition species is a metal such as copper. Furthermore, sustained exposure to the deposition species may contaminate the chuck to such an extent as to make the chuck inoperative. Consequently, it is imperative that none of the surfaces of the chuck be exposed to the deposition species.

Therefore, there is a need in the art for shields that provide adequate shielding for an electrostatic chuck.

SUMMARY OF THE INVENTION

The invention is a shield assembly that circumscribes an electrostatic chuck within a semiconductor processing system and protects the chuck from exposure to deposition species within the system. The shield assembly comprises a removable shadow ring and an alignment ring. The alignment ring rests upon a circumferential flange extending from the outer edge of the electrostatic chuck. The support surface of the chuck, upon which a substrate is retained, has a diameter that is slightly smaller than the diameter of a substrate. Consequently, a substrate retained by the chuck overhangs an inner portion of the top surface of the alignment ring. The shadow ring circumscribes the peripheral edge of the electrostatic chuck and is coaxially aligned with the center axis of the chuck. The shadow ring rests upon an outer portion of the top surface of the alignment ring. The shadow ring has a roof portion that overhangs the outer peripheral edge of the substrate, but does not contact the substrate. The roof portion also defines a labyrinth gap between the shadow and alignment rings. The labyrinth gap ensures that the electrostatic chuck is not exposed to the deposition species.

Importantly, the shield assembly is effective and easily removed from the pedestal for cleaning and/or replacement. In addition, other components operating in conjunction with the removable shield assembly, including a chamber shield member, define an assembly that is especially tailored to eliminate contact of the deposition species with the electrostatic chuck.

BRIEF DESCRIPTION OF THE DRAWING

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
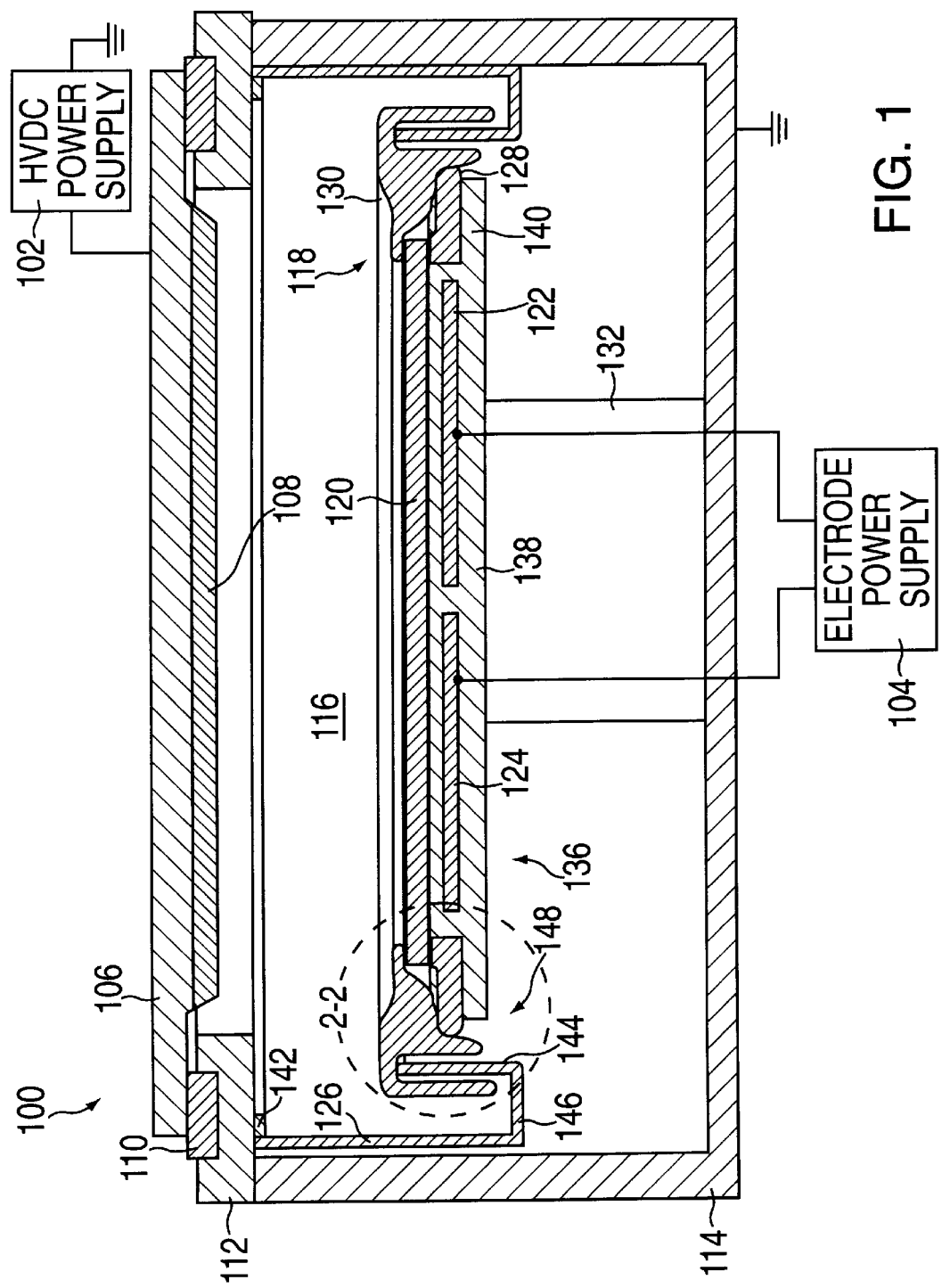
FIG. 1 is a schematic simplified partial vertical section view of a shielded processing chamber which embodies the present invention.

FIG. 1 is a simplified schematic drawing illustrating the shield assembly 118 of the present invention incorporated in a semiconductor wafer processing system 100. The invention effectively shields an electrostatic chuck 136 from the deposition species, yet affords easy removal of the shield components for cleaning or replacement. The invention is generally applicable to deposition chambers of semiconductor wafer processing systems, including, for example, physical vapor deposition (PVD) or sputtering chambers, chemical vapor deposition (CVD) chambers, and ion implant chambers where an electrostatic chuck is used to retain a substrate within the chamber.

By way of example, FIG. 1 schematically illustrates a PVD or sputtering system 100. The system 100 contains a vacuum chamber 116, an electrostatic chuck 136, a shield assembly 118 and an elevator system 132. The substrate 120 (e.g., a semiconductor wafer) is positioned upon a support surface of the electrostatic chuck 136. In the exemplary arrangement, the electrostatic chuck 136 is attached, as by a plurality of screws, to a conventional vertically movable elevator system 132. (Please note, conventional hardware such as gas inlet manifolds and/or vacuum pumps are omitted for clarity.)

The exemplary vacuum chamber 116 includes a cylindrical chamber wall 114 and a support ring 112 which is mounted to the top of the chamber wall, as by welding. The top of the chamber is closed by a target plate 106. The plate 106 is electrically insulated from the chamber walls 114 by an annular insulator 110 that rests between the target plate 106 and the support ring 112. Generally, to ensure the integrity of the vacuum in the chamber 116, O-rings (not shown) are used above and below the insulator 110 to provide a vacuum seal. The target plate 106 may be fabricated of a material that will become the deposition species or it may contain a coating 108 of the deposition species. To facilitate the sputtering process, a high voltage DC power supply 102 is connected between the target 106 and the chamber walls 114.

The electrostatic chuck 136 retains and supports a substrate 120 within the chamber 116. In the preferred embodiment of the invention, the electrostatic chuck 136 contains one or more electrodes 122 and 124 imbedded within a ceramic chuck body 108. In a conventional manner, the electrodes are driven by a voltage from an electrode power supply 104 and, in response to application of the voltage, the substrate 120 is electrostatically clamped to the support surface of the chuck. The ceramic chuck body is, for example, fabricated of aluminum-nitride or boron-nitride. Such a relatively low resistivity material promotes the Johnsen-Rahbek effect during high temperature processing. Other relatively low resistivity ceramics also form useful high temperature chuck materials such as alumina doped with a titanium oxide or a chromium oxide. If the chuck is to be used at low temperatures only, then other ceramic and/or dielectric materials such as alumina are used to form the chuck body. An illustrative ceramic electrostatic chuck is disclosed in U.S. Pat. No. 5,117,121 issued May 26, 1992 and U.S. patent application Ser. No. 08/612,652 filed Mar. 8, 1996, both of which are herein incorporated by reference. Examples of non-ceramic electrostatic chucks are disclosed in U.S. Pat. No. 4,184,188 issued Jan. 15, 1980 and U.S. Pat. No. 4,384,918 issued May 24, 1983, both of which are incorporated herein by reference.

A wall-like cylindrical shield member 126 is mounted to the support ring 112. That is, the cylindrical shield 126 has an inwardly (or outwardly) extending upper lip 142 which is attached to the bottom of the adapter plate 112 by a plurality of screws. The cylindrical shape of the shield member 126 is illustrative of a shield member that conforms to the shape of the chamber and/or the substrate. The shield member 126 may, of course, be of any shape. A flange 144 extending upward from annular bottom wall 146 of the shield member 126 surrounds the periphery of the electrostatic chuck 136, leaving a space 148 between the flange 144 and the chuck 136.

In addition to the shield member 126, the shield assembly 118 also includes an annular shadow ring 130 having an inner diameter which is selected so that the ring fits peripherally over the edge of the substrate 120 without contacting the substrate. The shadow ring rests upon an alignment ring 128 and the alignment ring 128 is supported by a flange 140 that extends from the electrostatic chuck.

Figure 2:
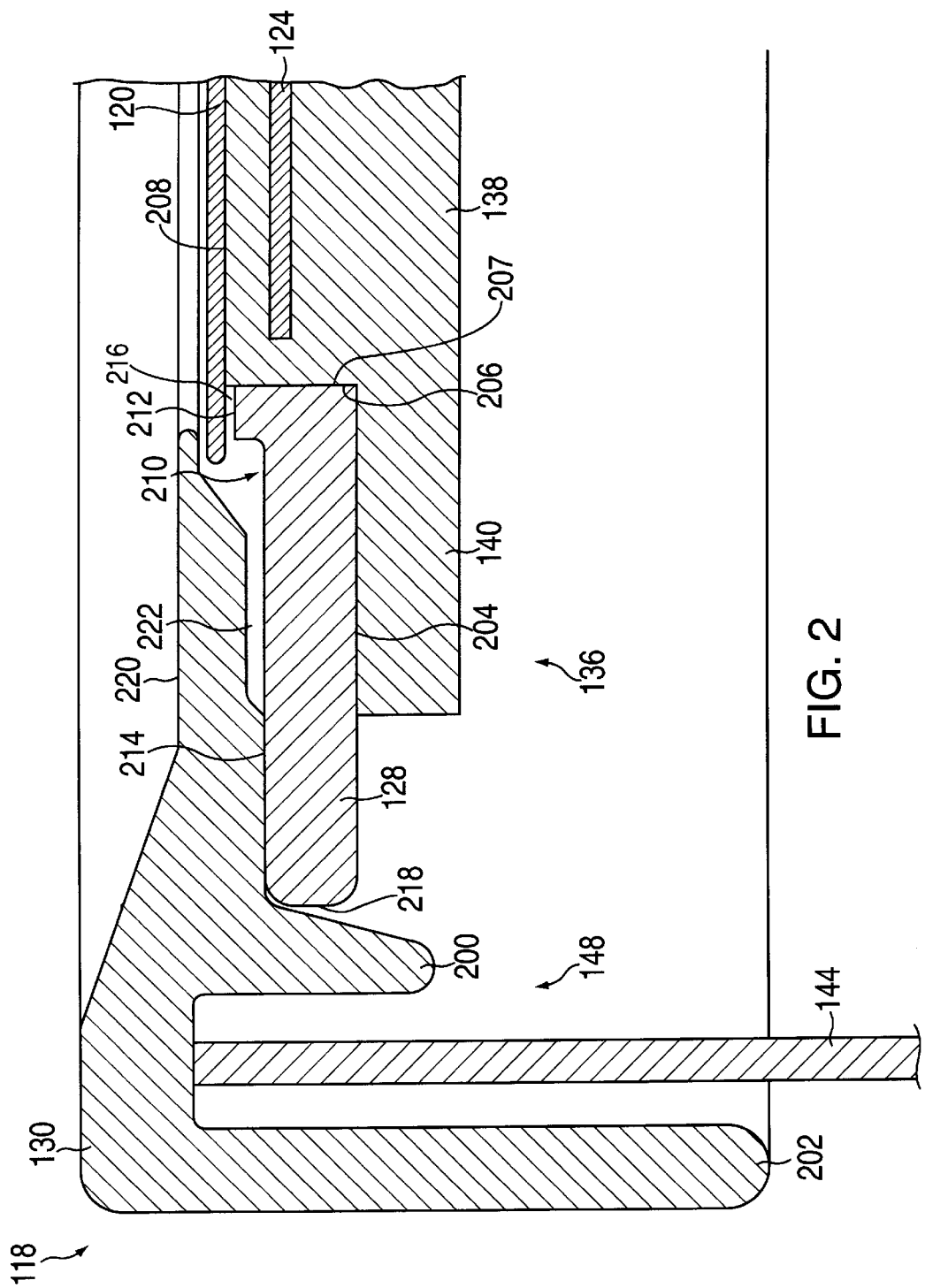
FIG. 2 is a detailed, cross-sectional view of region 2—2 of FIG. 1.

FIG. 2 depicts a detailed cross-sectional view of the shield assembly 118 within region 2—2 of FIG. 1. The alignment ring 128 rests upon an upper surface 206 of the flange 140 of the chuck 136. When in position on the chuck flange, an inner diameter surface 206 of the alignment ring 128 substantially abuts the outer peripheral surface 207 of the chuck. The support surface 208 of the chuck has a diameter that is slightly smaller than the diameter of a substrate 120. As such, the peripheral edge of the substrate overhangs the edge of the chuck and, consequently, overhangs the top surface 210 of the alignment ring 128. The top surface 210 of the alignment ring 128 has two portions. A first portion 212 is spaced-apart and parallel to the backside peripheral edge surface of the substrate 120 to form a gap 216 having a width of 0.3 mm. A second portion 214 is recessed from the first portion by approximately 1.0 mm. and forms a support surface for the shadow ring 130. The outer diameter surface 218 of the alignment ring 128 has a "radiused edge" structure.

The shadow ring 130 comprises a downward extending, tapered centering flange 200 which fits into the opening 148 between the shield member flange 144 and the side edge of the chuck 136, and a second, outer flange 202 which is generally parallel to flange 144. The shadow ring 130 is mounted in removable fashion at the periphery of the substrate 120 by seating the two flanges 200 and 202 over the mating flange 144 of the cylindrical shield member 126, with the tapered centering flange 200 extending into the opening 148. Additionally, to facilitate accurate positioning of the shadow ring with respect to the substrate, the tapered centering flange 200 abuts the "radiused" surface 218 of the alignment ring 128 and the shadow ring repeatably aligns with the substrate and the chuck. The alignment tolerance is ±5 mils.

The shadow ring 130 also comprises a raised, inward-extending roof portion 220 which overhangs and protects the periphery of the substrate 120 and prevents deposition on the surfaces on which the shadow ring 130 rests and on the associated ring-surface interfaces. To facilitate such protection when the shadow ring 130 rests upon the alignment ring 128, a bottom surface of the roof portion 220 is sculpted to form a labyrinth gap 222 between the alignment ring 128 and the shadow ring 130. The labyrinth gap 222 extends along the top peripheral edge surface of the substrate 120 for a distance of approximately 24 mils at a spacing from the substrate of approximately 12 mils, slopes downward past the edge of the substrate 120, and then extends laterally along the second portion 214 of the top surface 210 of the alignment ring 128 for a length of approximately 0.25 inches and a height of approximately 30 mils. To sufficiently eliminate deposition species penetration into the labyrinth gap 222, the ratio of the overhang distance of the roof portion over the substrate to the spacing between the overhang and the substrate surface is between 1.5 and 2. Furthermore, to ensure that any species that do penetrate the labyrinth gap 222 do not cause adhesion of the shadow ring to the alignment ring, the gap therebetween should be approximately 30 mils. With this gap, deposition species should not cause the shield components to adhere to one another nor adhere to the substrate. Furthermore, the combination of shield components ensures that the deposition species will not contact the electrostatic chuck.

As mentioned, the shield assembly uniquely combines full effective shielding of the chamber with easy removal. Specifically, effective shielding action is provided by the cylindrical shield member 126, the relatively wide electrostatic chuck 136 (that is, the chuck flange 140 extends laterally beyond the substrate) the alignment ring 128, which overlaps the backside peripheral edge of the substrate and the chuck, and the shadow ring 130, which overlaps both the chuck and the inward-extending bottom section of the shield member 126. These overlapping components combine to isolate the processing region of the chamber 116 from the rest of the chamber interior and shield the rest of the chamber (for example, chamber walls 114 and the internal chamber hardware such as the chuck 136 and the movable elevator 132) from deposition. The shield components are easily removed, by removing the target and the adapter plate mounting hardware and lifting, as a unit, the adapter plate 112; the shield member 126, which is attached to the adapter plate; and the shadow ring 130, which is supported in removable fashion on the shield member 126. The alignment ring 128 can then lifted from the chamber.

In use, the elevator system 132 vertically raises and lowers the electrostatic chuck 132 to enable a wafer transport robot (not shown) to place and retrieve the substrate from the support surface of the chuck. When the chuck 136 is lowered, the shadow ring 130 rests on the flange 144 the shield member 126 and is separated from the alignment ring 128. Once the substrate 120 is placed upon the chuck 136, the chuck is raised to place the substrate into a process position within the chamber. As the chuck is raised, the alignment ring 128 contacts the shadow ring 130 forming the labyrinth gap 222. Interaction of the centering flange 200 and the surface 118 of the alignment ring centers the shadow ring 130, e.g., the shadow ring becomes coaxially aligned with a central axis of the chuck 136. Additionally, through use of the present invention, the electrostatic chuck 136 does not contact the shadow ring 130 and, as such, is not subject to being chipped or cracked by the impact with the shadow ring. In essence, the alignment ring 128 operates as a buffer to absorb the shock of contact with the shadow ring as the chuck is raised into the process position. This is an extremely important aspect of the invention for electrostatic chucks that are fabricated from ceramic materials such as aluminum-nitride, boron-nitride and the like.

Useful material for the components of the shield assembly 118 must meet the environmental requirements of the processing system 100. As such, for high temperature PVD systems (e.g., deposition temperatures greater than 500° C.), the shadow and alignment rings are fabricated from alumina. Low temperature systems may use such materials as stainless steel, aluminum, titanium and copper. In these low temperature systems, stainless steel is a preferred material because it is relatively easy to clean. Aluminum or copper may be preferred when depositing materials such as tungsten which do not stick to stainless steel.

Although various embodiments which incorporate the teachings of the present invention have been shown and described in detail herein, those skilled in the art can readily devise many other varied embodiments that still incorporate these teachings.

What is claimed is:

1. Apparatus comprising:
   an electrostatic chuck having a support surface for supporting a substrate and having a flange extending from an outer edge of the electrostatic chuck;
   alignment ring, circumscribing said support surface and removably supported by said flange, for shielding said electrostatic chuck;
   a shadow ring, circumscribing said support surface and removably supported by said alignment ring, having a roof portion that overhangs a peripheral edge surface of said substrate and defines a labyrinth gap between said alignment ring and said shadow ring.

2. The apparatus of claim 1 wherein said alignment ring is annular and has a surface that abuts a centering flange of the shadow ring to align said shadow ring with respect to said electrostatic chuck.

3. The apparatus of claim 1 further comprising an annular shield member having a mating flange that interacts with said shadow ring.

4. The apparatus of claim 1 wherein said electrostatic chuck further comprises at least one electrode embedded within a chuck body fabricated of a ceramic material.

5. The apparatus of claim 1 wherein said chuck body is fabricated of aluminum-nitride.

6. The apparatus of claim 1 wherein said shadow ring is fabricated of alumina.

7. The apparatus of claim 1 wherein said alignment ring is fabricated of alumina.

8. A deposition chamber shield assembly for restricting the deposition of materials on internal chamber components during processing of a substrate in the deposition chamber, comprising:
   a shield member extending circumferentially around the substrate to prevent deposition on the deposition chamber regions shielded by said shield member during processing of the substrate in the deposition chamber;
   an alignment ring circumscribing an electrostatic chuck having a support surface for supporting the substrate and having a flange extending from the outer edge of the electrostatic chuck, the alignment ring is removably supported by said flange, for shielding said electrostatic chuck; and
   a shadow ring extending from the shield member over an outer edge of the alignment ring and overhanging an edge of the substrate, said shadow ring defining a labyrinth gap between the shadow ring and the alignment ring to prevent the passage of deposition materials past the edge of substrate.

9. The deposition chamber shield assembly of claim 8 wherein said alignment ring is annular and has a surface that abuts a centering flange of the shadow ring to align said shadow ring with respect to the electrostatic chuck.

10. The deposition chamber shield assembly of claim 8 further comprising an annular shield member having a mating flange that interacts with said shadow ring.

11. The apparatus of claim 8 wherein said electrostatic chuck further comprises at least one electrode embedded within a chuck body fabricated of a ceramic material.

12. The apparatus of claim 8 wherein said chuck body is fabricated of aluminum-nitride.

13. The apparatus of claim 8 wherein said shadow ring is fabricated of alumina.

14. The apparatus of claim 8 wherein said alignment ring is fabricated of alumina.

15. An apparatus comprising:
   an electrostatic chuck having a support surface for supporting a substrate and having a flange extending from the outer edge of the electrostatic chuck;
   an alignment ring, removably circumscribing said support surface and supported by said flange, said alignment ring having an upper surface below the plane of said support surface;
   a shadow ring, removably circumscribing said support surface, said shadow ring disposed above and covering said alignment ring.

16. The apparatus of claim 15 wherein said alignment ring is annular, said support surface of said alignment ring abutting a centering flange of said shadow ring to align said shadow ring with respect to said electrostatic chuck.

17. The apparatus of claim 15 further comprising an annular shield member having a mating flange that interacts with said shadow ring.

18. The apparatus of claim 15 wherein said electrostatic chuck further comprises at least one electrode embedded within a chuck body fabricated of a ceramic material.

19. The apparatus of claim 18 wherein said chuck body is fabricated of aluminum-nitride.

20. The apparatus of claim 15 wherein said shadow ring and said alignment ring are fabricated of alumina.

* * * * *